United States Patent [19]
Capelle, Jr.

[11] Patent Number: 4,585,121
[45] Date of Patent: Apr. 29, 1986

[54] CONTAINER FOR MULTICHIP HYBRID PACKAGE

[75] Inventor: Ernest A. Capelle, Jr., Columbia, Md.

[73] Assignee: The United States of America as represented by the Secretary of the Navy, Washington, D.C.

[21] Appl. No.: 747,601

[22] Filed: Jun. 24, 1985

[51] Int. Cl.$^4$ .............................................. B65D 73/02
[52] U.S. Cl. .................................... 206/331; 206/332; 206/334; 206/583
[58] Field of Search ................ 206/583, 332, 334, 383

[56] References Cited

U.S. PATENT DOCUMENTS

| | | | |
|---|---|---|---|
| 3,454,921 | 7/1969 | Coleman et al. | 206/331 |
| 3,692,264 | 9/1972 | Burkhard et al. | 206/583 |
| 3,746,157 | 7/1973 | l'Anson | 206/331 |
| 4,026,412 | 5/1977 | Henson | 206/331 |
| 4,234,092 | 11/1980 | Axel | 206/583 |
| 4,413,731 | 11/1983 | Weideman | 206/583 |
| 4,480,747 | 11/1984 | Kazor et al. | 206/328 |

*Primary Examiner*—Joseph Man-Fu Moy
*Attorney, Agent, or Firm*—Robert F. Beers; Henry Hansen

[57] ABSTRACT

A container for storing and handling multichip hybrid packages (MHP's) during manufacture, testing and inspection. The receptacle and cover are recessed to receive a wide range of MHP sizes and configurations. An aperture in the cover provides visible access to the MHP without removing it or opening the container. The container is made of electrically conductive, high temperature resistant carbon plastic for protection from electrostatic discharges and environmental temperature chamber testing.

2 Claims, 3 Drawing Figures

CONTAINER FOR MULTICHIP HYBRID PACKAGE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to containers, and more particularly to containers for handling and storing multichip hybrid packages (MHP's).

MHP's are useful as space-saving electronic circuits easily mounted on printed circuit boards, particularly in avionics applications. They generally include bare chip die epoxy-mounted and wire-bonded to a ceramic multilayered substrate within a hermetically sealed rectangular casing and rows of electrical leads extending from opposite ends. MHP's come in a variety of sizes, exclusive of the leads, from the smallest—0.40" wide by 0.40" long—to the largest—2.05" wide by 1.15" long.

Handling, storing, and overall protecting MHP's during manufacture, testing, and inspection has become a major problem with their increasing sizes and configurations. In addition, some have guards mounted over the leads to protect them from bending or twisting, while others have shorting bars on the leads to protect the chips from electrical damage. Heretofore, a container was specially designed for each unique MHP size and configuration. The design usually precluded visible access for identifying the MHP without opening the container, nor could the MHP be tested in environmental temperature chambers nor inspected without first removing it from the container. In some manufacturing processes, or during inspection and testing, MHP's were also damaged by electrostatic discharge when their containers were left open.

SUMMARY OF THE INVENTION

Accordingly, it is an object of the present invention to provide a container for storing and handling MHP's during the manufacturing, testing, and inspection phases. Another object is to provide a container which is particularly suited for accomodating a wide range of MHP sizes and configurations. Still another object is to provide a container for accomodating MHP's equipped with shorting bars or lead guards. Further objects are to provide a container which affords Faraday cage protection against electrostatic discharge, which enables visual access for identification of MHP's without opening the container, and which permits inspection and testing in environmental temperature chambers while the MHP remains in the container.

Briefly, these and other objects and features of the invention are accomplished by a container formed of a rectangular receptacle and a hinged cover. The confronting faces of the receptacle and cover are recessed to receive a wide range of MHP sizes and configurations. The cover includes an aperture through which the entire case of the MHP can be seen for identification without having to open the container. The receptacle and cover are made from an electrically conductive, high temperature resistant carbon plastic for Faraday cage protection against electrostatic discharges and environmental temperature chamber testing.

Other objects, advantages and novel features of the invention will become more apparent from the following detailed description when considered in conjunction with the accompanying drawings wherein:

DESCRIPTION OF THE PREFERRED EMBODIMENT

Figure 1:
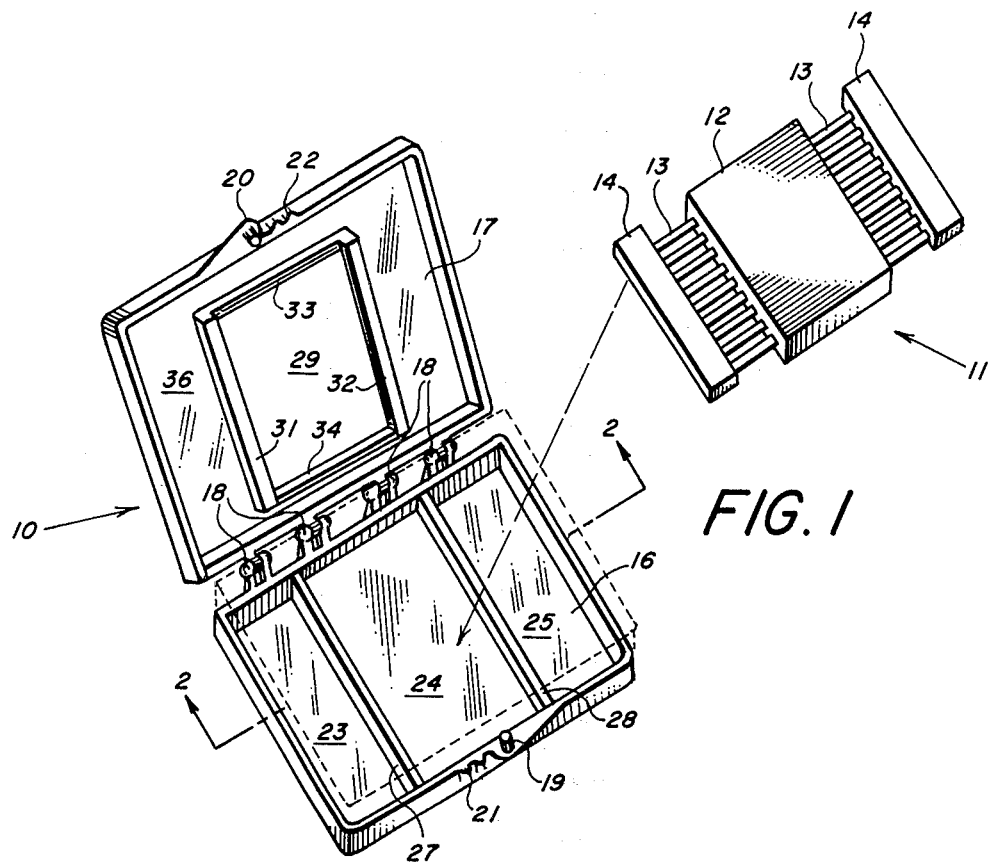
FIG. 1 is an isometric view of a container according to the invention opened for receiving a multichip hybrid package (MHP)
Figure 2:
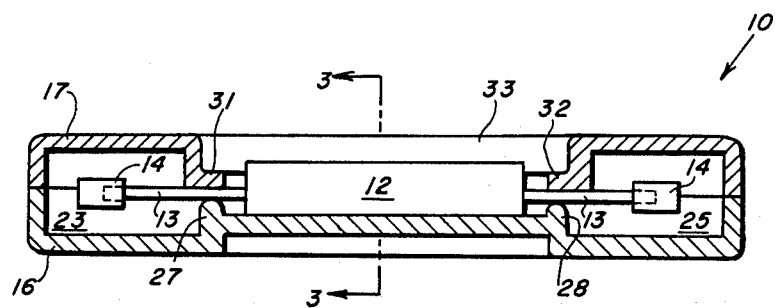
FIG. 2 is a cross-sectional view of the container when closed about an MHP taken along the line 2—2.
Figure 3:
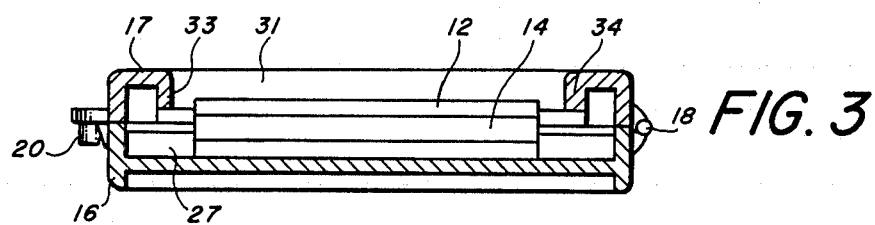
FIG. 3 is a cross-sectional view of the closed container taken along the line 3—3 of FIG. 2.

Referring now to the drawings wherein like characters designate like or corresponding parts throughout the several views, there is shown in FIG. 1 a container 10 opened for receiving a multichip hybrid package (MHP) 11 consisting of a casing 12 containing IC (integrated circuit) chips on a substrate with a row of leads 13 extending from each end for electrically connecting to printed circuit boards. The ends of leads 13 are inserted in shorting bars 14 for protecting the circuits within casing 12 against untoward voltages between the leads, and for preventing the leads from bending or twisting before being put into use.

Container 10 comprises a rectangular receptacle 6 and a corresponding cover 17 hinged along one side by a plurality of interlocking knuckles 18. The receptacle 16 and cover 17 are formed from an electrically conductive carbon plastic reinforced with an additive for strength and temperature resistance, and are preferrably thermoplastic molded with the knuckles 18 formed thereon. A plastic is selected for temperature resistance at least up to 130° C. and electrical resistance at least $1 \times 10^8$ ohms/sq. inch. Cover 17 is snapped closed by a pair of tab 19 and 20, extending from the sides of receptacle 16 and cover 17, respectively, opposite of knuckles 18, into registering detents 21 and 22, respectively. The tabs and detents are also preferably formed on the receptacle and cover during molding.

Receptacle 16 is recessed to form three compartments 23, 24 and 25 partitioned by dividers 27 and 28 extending between the sides. The depth of the center compartment 24 is sufficient for accommodating the portion below leads 13 of the thickest MHP case 12; and the depth of compartments 23 and 25 is sufficient for accomodating the portion below lead 13 of the thickest shorting bars 14. The lengths and widths of the compartments 23, 24, and 25 are also selected to accomodate the casings 12 and shorting bars 14 of the largest MHP 11. For the largest MHP, aforementioned, container 10 has outside dimensions approximately 2.4" w×3.2" l×0.5" d, with compartments 23 and 25 each approximately 2.2" w×0.8" l×0.2" d, and with compartment 24 approximately 2.2" w×1.4" l×0.1" d.

A rectangular aperture 29 in cover 17 provides visible access to identifying legends on the MHP casing 12 without having to remove the MHP. The opposite ends of aperture 29 include ledges 31 and 32 which straddle the ends of casing 12 for clamping leads 13 in place against dividers 27 and 28 when cover 17 is fully closed over MHP 11. The sides of aperture 29 also include ledges 33 and 34 which straddle the sides of casing 12 and provide stiffening to cover 17. The inside surface 36 of cover 17 around the ledges is hollowed to nearly the same depth as compartments 23 and 25 for accommodating the portions above leads 13 of the thickest shorting bars 14. Thus, there are no obstructions in either receptacle 16 or cover 17 to full closure of the container 10 with an MHP positively secured therein.

Some of the many features and advantages of the invention should now be readily apparent. For instance, a container is described which is highly suited for use during manufacture, testing, and inspection of a wide range of sizes and configurations of MHP's. It will positively secure MHP's equipped with shorting bars or lead guards, and will protect circuits therein from electrostatic discharges. The container may be used while testing MHP's in environmental temperature chambers, and will allow visual access to the MHP for identification without opening the container or removing the MHP. The container design is also particularly suitable for manufacture low cost thermoplastic molding.

It will be understood that various changes in the details, steps and arrangement of parts, which have been herein described and illustrated in order to explain the nature of the invention, may be made by those skilled in the art within the principle and scope of the invention as expressed in the appended claims.

What is claimed is:

1. A container for all sizes of multichip hybrid packages, each package including a rectangular casing with rows of leads extending from either end, said container comprising:

a rectangular receptacle having a pair of transverse dividers forming three compartments along the length thereof, the center compartment being formed to receive all sizes of rectangular casings and the end compartments being formed to receive the leads;

a cover coextensive with said receptacle having an aperture coextensive with said center compartment for fully exposing the rectangular casing, said cover including ledges at either end of said aperture aligned with said dividers for clamping the leads in place therebetween and thereby securing the package; and said receptacle and cover being constructed of an electrically conductive carbon plastic with additives for strength and temperature resistance.

2. A container according to claim 1 wherein the package includes shorting bars on the lead ends, said container further comprising: p1 said end compartments being formed to receive that portion of the shorting bars which extends below the leads; and said cover having a recess around said aperture formed to receive that portion of the shorting bars that extends above the leads.

* * * * *